US 12,382,652 B2

(12) United States Patent
Zuniga et al.

(10) Patent No.: US 12,382,652 B2
(45) Date of Patent: Aug. 5, 2025

(54) TRANSISTOR STRUCTURE USING MULTIPLE TWO-DIMENSIONAL CHANNELS

(71) Applicant: Infineon Technologies Canada Inc., Ottawa (CA)

(72) Inventors: Marco A Zuniga, Berkeley, CA (US); Thomas William Macelwee, Nepean (CA); Vineet Unni, Kanata (CA); Claudio Andres Canizares, Morgan Hill, CA (US)

(73) Assignee: Infineon Technologies Canada Inc., Ottawa (CA)

( * ) Notice: Subject to any disclaimer, the term of this patent is extended or adjusted under 35 U.S.C. 154(b) by 47 days.

(21) Appl. No.: 18/331,071

(22) Filed: Jun. 7, 2023

(65) Prior Publication Data

US 2024/0413234 A1 Dec. 12, 2024

(51) Int. Cl.
*H10D 30/47* (2025.01)
*H03K 17/687* (2006.01)
*H10D 62/85* (2025.01)
*H10D 64/23* (2025.01)

(52) U.S. Cl.
CPC ........ *H10D 30/475* (2025.01); *H03K 17/6871* (2013.01); *H10D 62/8503* (2025.01); *H10D 64/254* (2025.01)

(58) Field of Classification Search
CPC ............ H01L 29/7786; H01L 29/2003; H01L 29/4175; H01L 29/778; H01L 29/78; H03K 17/6871; H10D 30/475; H10D 62/8503; H10D 64/254; H10D 64/256; H10D 62/343
See application file for complete search history.

(56) References Cited

U.S. PATENT DOCUMENTS

2016/0049504 A1  2/2016  Renaldo et al.
2019/0198652 A1* 6/2019  Kushida ............. H01L 29/7789
2024/0213354 A1* 6/2024  Fiorenza ............. H01L 29/404

FOREIGN PATENT DOCUMENTS

EP          4391067 A1     6/2024

OTHER PUBLICATIONS

"Multi-Channel Monolithic-Cascade Hemt (MC2-HEMT): A New GaN Power Switch up to 10 KV" Proceedings of the 2021 IEEE International Electron Devices Meeting (IEDM), IEEE, Dec. 11, 2021. 04 Pages.
European Search Report received for Application no./patent no. (24180334.5 - 1211) (WN# 22520.26b) Sep. 25, 2024. 12 pages.

* cited by examiner

*Primary Examiner* — Jung Kim
(74) *Attorney, Agent, or Firm* — WORKMAN NYDEGGER

(57) ABSTRACT

A transistor structure that includes multiple heterojunction layer sets, each generating a two-dimensional electron gas (2DEG), such that the transistor structure has a stack of 2DEGs that may be used to conduct between source and drain. A terminal is provided proximate an uppermost 2DEG to control whether the uppermost 2DEG is continuous between a source contact and a source plug. A source plug connects the uppermost 2DEG with the next 2DEG, and a drain plug also connects the uppermost 2DEG with the next 2DEG. Thus, the gate terminal may control the flow of current in sub-surface 2DEGs between the source and drain.

20 Claims, 4 Drawing Sheets

TRANSISTOR STRUCTURE USING MULTIPLE TWO-DIMENSIONAL CHANNELS

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current-hence the term "field-effect transistor".

Silicon has traditionally been used to fabricate transistors. However, wider bandgap semiconductor material may be used to fabricate transistors that conduct higher power and operate at higher efficiency than silicon transistors. Silicon carbide (SiC), Aluminum Nitride (AlN) Zinc Oxide (ZnO), and Gallium Nitride (GaN) are each examples of wide bandgap semiconductor materials that can be used in power electronics. One way to use such wider bandgap semiconductor materials is to form two layers of different semiconductor materials to therebetween form a heterojunction.

These two semiconductor materials may have sufficiently different bandgaps such that when brought together, the joined bandgap drops below the Fermi level just within the channel layer. This means that electrons may freely flow within this region. This region is thin in depth and forms a plane parallel to the upper surface of the channel region. Thus, this region is called a "2DEG" region to emphasize its planar form. Furthermore, this region is also referred to as a "Two-Dimensional Electron Gas" (or "2DEG") due to the high mobility of electrons in this region. Thus, the 2DEG is highly conductive. The 2DEG may form the channel region of a power semiconductor to allow passage of high currents with relatively low resistance.

A 2DEG can be formed in the heterostructures of certain semiconductor pairs that have different bandgaps and band alignments. These pairs typically include a wide bandgap material and a narrow bandgap material. The formation of a 2DEG depends on the specific properties of the materials, such as the lattice constant, electron affinity, and band offset.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a transistor structure that includes multiple heterojunction layer sets. For instance, a first heterojunction layer set includes a first barrier semiconductor layer and a first channel semiconductor layer and a first heterojunction formed at an interface between the first barrier semiconductor layer and the first channel semiconductor layer. The first heterojunction induces a first two-dimensional electron gas (2DEG) within the first channel semiconductor layer. The second heterojunction layer set includes a second barrier semiconductor layer and a second channel semiconductor layer and a second heterojunction formed at an interface between the second barrier semiconductor layer and the second channel semiconductor layer. The second heterojunction induces a second 2DEG within the second channel semiconductor layer.

A source contact is in conductive contact with the first 2DEG at a portion of the first 2DEG. Additionally, a conductive source plug extends between the first 2DEG and the second 2DEG so as to connect the first 2DEG with the second 2DEG. A gate terminal is proximate the first 2DEG such that voltages applied to the gate terminal control whether the first 2DEG is continuous between the conductive source plug and the portion of the first 2DEG that is in conductive contact with the source contact. The transistor structure also has a drain contact and a conductive drain plug extending from the drain contact through the first heterojunction layer set through the first 2DEG and to the second 2DEG. Accordingly, when a voltage is applied to the gate terminal that is sufficient that the first 2DEG is continuous between the conductive source plug and the portion of the first 2DEG that is in conductive contact with the source contact, a current path is formed between the source contact and the drain contact via the first 2DEG, the conductive source plug, the second 2DEG, and the conductive drain plug.

Thus, the transistor structures may make use of conductive paths in one or more 2DEGs that are below the most surface-level 2DEG, while still permitting gate control just above the most surface-level 2DEG. This has the potential to provide a significant number of technical benefits depending on how the sub-surface 2DEG(s) is or are used. For instance, the transistor structure may use multiple 2DEGs to channel current between source and drain thereby substantially reducing on-resistance. Furthermore, the transistor structure may even perform the function to two or more independently controllable transistors that each share source and drain.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 4 illustrates a flowchart of a method that is performed by the control circuit of FIG. 3 in response to determining that the transistor is to be turned on.

DETAILED DESCRIPTION

Figure 1:
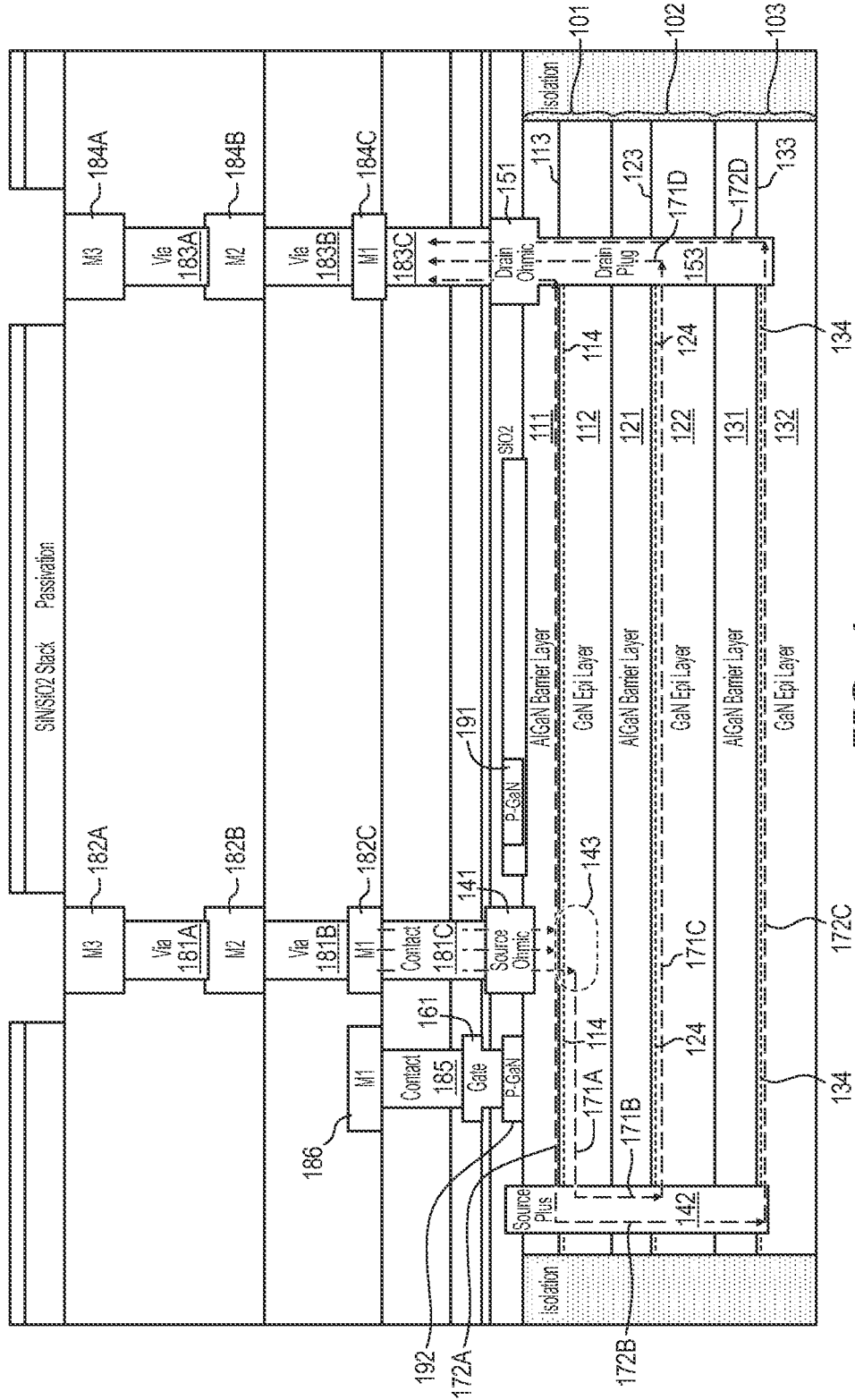
FIG. 1 illustrates a transistor structure that is merely a very specific example of the broader aspects described herein, and which includes a transistor that uses two sub-surface 2DEGs to communicate between source and drain.

Embodiments described herein relate to a transistor structure that includes multiple heterojunction layer sets, each including a respective barrier semiconductor layer and channel semiconductor layer with a heterojunction therebetween. For instance, if there are at least two heterojunction layer set, there would be a "first" heterojunction layer set and a "second" heterojunction layer set. Hereinafter, the terms "first", "second", "third" and so forth are used merely to identify an item, and distinguish one of that item from another of that item, and not to imply any type of ordering of the items. Furthermore, elements of the first heterojunction layer set will also use the modifier "first" to merely indicate that the element is part of the first heterojunction layer set. Similar nomenclature will be used for a second heterojunction layer, and if applicable, a third heterojunction layer, and so forth.

One heterojunction layer set (called herein a "first" heterojunction layer set) includes a first barrier semiconductor layer and a first channel semiconductor layer. There is a first heterojunction formed at the interface between the first barrier semiconductor layer and the first channel semiconductor layer. The first heterojunction induces a first two-dimensional electron gas (2DEG) within the first channel semiconductor layer. Another heterojunction layer set (called herein a "second" heterojunction layer set) includes a second barrier semiconductor layer and a second channel semiconductor layer. Furthermore, a second heterojunction is formed at the interface between the second barrier semiconductor layer and the second channel semiconductor layer. The second heterojunction induces a second 2DEG within the second channel semiconductor layer.

Though there may be exactly two heterojunction layer sets, the principles described herein extend to any plural number of heterojunction layer sets, and thus any number of 2DEGs. Thus, the transistor structure uses heterojunctions to induce a stack of 2DEGs, each 2DEG extending parallel to the layers, and being stacked perpendicular to the plane in which the 2DEGs each extend.

A source contact is in conductive contact with the first 2DEG at a portion of the first 2DEG. Additionally, a conductive source plug extends between the first 2DEG and the second 2DEG so as to, connect the first 2DEG with the second 2DEG (and potentially connect the first 2DEG to more 2DEGs if there are yet more heterojunction layer sets). A gate terminal is proximate the first 2DEG such that voltages applied to the gate terminal control whether the first 2DEG is continuous between the conductive source plug and the portion of the first 2DEG that is in conductive contact with the source contact. The transistor structure also has a drain contact and a conductive drain plug extending from the drain contact through the first heterojunction layer set through the first 2DEG and to the second 2DEG (and potentially to additional 2DEGs if there yet more heterojunction layer sets).

Accordingly, when a voltage is applied to the gate terminal that is sufficient that the first 2DEG is continuous between the conductive source plug and the portion of the first 2DEG that is in conductive contact with the source contact, a current path is formed between the source contact and the drain contact via the first 2DEG, the conductive source plug, the second 2DEG, and the conductive drain plug. If there are more than two heterojunction layer sets and more than two 2DEGs, and the conductive source plug and conductive drain plug each extend to contact the additional 2DEGs, and the voltage is applied to the gate terminal, then for each additional 2DEG, an additional current path would be formed between the source contact and drain contact via the first 2DEG, the conductive source plug, the respective 2DEG, and the conductive drain plug.

Thus, the transistor structure may make use of conductive paths in one or more 2DEGs that are below the most surface-level 2DEG, while still permitting gate control just above the most surface-level 2DEG. This has the potential to provide a significant number of technical benefits depending on how the sub-surface 2DEG(s) is or are used. For instance, the transistor structure may use multiple 2DEGs to channel current between source and drain thereby substantially reducing on-resistance. Furthermore, the transistor structure may even perform as two or more independently controllable transistors that each share source and drain.

FIG. 1 illustrates a transistor structure 100 that is merely a very specific example of the broader aspects described herein. The transistor structure 100 includes multiple heterojunction layers sets. In the specific example of FIG. 1, the transistor structure 100 includes three heterojunction layer sets 101, 102 and 103. However, again, the principles described herein apply for transistor structures that have any plural number of heterojunction layer sets. Although not shown, the heterojunction layer sets 101, 102 and 103 may be fabricated on other semiconductor layers, such as a silicon substrate, and intervening strain relief layers.

Each of the heterojunction layer sets 101, 102 and 103 includes a respective barrier semiconductor layer and a respective channel semiconductor layer with a heterojunction formed therebetween that induces a respective 2DEG. In FIG. 1, the heterojunction layer set 101 includes a barrier semiconductor layer 111 and a channel semiconductor layer 112 that has a heterojunction 113 formed at the interface between the barrier semiconductor layer 111 and the channel semiconductor layer 112. The heterojunction 113 induces a 2DEG 114 within the channel semiconductor layer 112. Moving to the next heterojunction layer set, the heterojunction layer set 102 includes a barrier semiconductor layer 121 and a channel semiconductor layer 122 that has a heterojunction 123 formed at the interface between the barrier semiconductor layer 121 and the channel semiconductor layer 122. The heterojunction 123 induces a 2DEG 124 within the channel semiconductor layer 122. Moving on to yet another heterojunction layer set, the heterojunction layer set 103 includes a barrier semiconductor layer 131 and a channel semiconductor layer 132 that has a heterojunction 133 formed at the interface between the barrier semiconductor layer 131 and the channel semiconductor layer 132. The heterojunction 133 induces a 2DEG 134 within the channel semiconductor layer 132.

FIG. 1 illustrates the barrier semiconductor layers 111, 121 and 131 as each being composed of AlGaN, and the channel semiconductor layers 112, 122 and 132 each being composed of GaN. This is a suitable selection of materials because GaN and AlGaN will form a heterojunction therebetween that would include a 2DEG in the GaN channel layer, at least for some selections of compositions of AlN and GaN within the AlGaN barrier layer. However, the principles described herein are not limited to what the barrier semiconductor layer and channel semiconductor layer is composed of, as other semiconductor combinations will also form a heterojunction sufficient to induce a 2DEG. As an example only, each of the barrier semiconductor layers may be AlInGaN or perhaps AlIInN, and each of the channel semiconductor layers may be GaN. As another example, each of the barrier semiconductor layers may be AlGaAs, and each of the channel semiconductor layers may be GaAs. Furthermore, one or more or all of the heterojunction layer sets may have different materials than the others for either or both of the channel semiconductor layer or the barrier semiconductor layer. The principles described herein will operate at a given heterojunction layer set so long as a 2DEG is induced by the respective heterojunction.

A p-doped GaN portion 191 (which is in a layer of SiO2) causes the first 2DEG 114 to be discontinuous underneath the P-doped GaN portion 191. A source contact 141 is in conductive contact with the first 2DEG 114 at a portion 143 of the first 2DEG 114. Additionally, a conductive source plug 142 extends between the first 2DEG 114 and the second 2DEG 124 so as to connect the first 2DEG 114 with the second 2DEG 124. Although not required, the conductive source plug 142 extends perpendicular to the plane of the first 2DEG 114 and the second 2DEG 124. In the example of FIG. 1, there is yet a third 2DEG 134. Thus, the conductive source plug 142 also extends through to the third 2DEG 134 so as to connect the first 2DEG 114, the second 2DEG 124, and the third 2DEG 134.

The transistor structure 100 also has a drain contact 151 and a conductive drain plug 153 extending from the drain contact 151 through the first heterojunction layer set 101 through the first 2DEG 114 and to the second 2DEG 124. Although not required, the conductive drain plug 153 extends perpendicular to the plane of the first 2DEG 114 and the second 2DEG 124. In the example of FIG. 1, there is yet a third 2DEG 134. Thus, the conductive drain plug 153 also extends through to the third 2DEG 134 so as to connect the first 2DEG 114, the second 2DEG 124, and the third 2DEG 134.

The transistor structure 100 also includes a gate terminal 161 that is proximate the first 2DEG 114 such that voltages applied to the gate terminal 161 controls whether the first 2DEG 114 is continuous between the conductive source plug 142 and the portion 143 of the first 2DEG 144 that is in conductive contact with the source contact 141. A p-doped GaN portion 192 causes there to be a discontinuity in the first 2DEG 114 underneath the gate terminal 161 unless a positive voltage is applied to the gate terminal 161. Thus, the illustrated transistor structure 100 is an enhancement mode transistor. However, the principles described herein also operate for depletion mode transistor, in which case there would not be a p-doped GaN portion 192.

Accordingly, when a voltage is applied to the gate terminal 161 that is sufficient that the first 2DEG 114 is continuous between the conductive source plug 142 and the portion 143 of the first 2DEG 114 that is in conductive contact with the source contact 141, a current path (see arrows 171A, 171B, 171C and 171D) is formed between the source contact 141 and the drain contact 151 via the first 2DEG 114 (see arrow 171A), the conductive source plug 142 (see arrow 171B), the second 2DEG 124 (see arrow 171C), and the conductive drain plug 153 (see arrow 171D). The current path represented by the combination of arrows 171A, 171B, 171C and 171D is called herein current path 171.

In the example of FIG. 1, there is yet a third 2DEG 134, the source plug 142 also extends to the third 2DEG 134, and the drain plug 153 also extends to the third 2DEG 134. Thus, when a voltage is applied to the gate terminal 161 that is sufficient that the first 2DEG 114 is continuous between the conductive source plug 142 and the portion 143 of the first 2DEG 114 that is in conductive contact with the source contact 141, another current path (see arrows 172A, 172B, 172C and 172D) is formed between the source contact 141 and the drain contact 151 via the first 2DEG 114 (see arrow 172A), the conductive source plug 142 (see arrow 172B), the third 2DEG 134 (see arrow 172C), and the conductive drain plug 153 (see arrow 172D). The current path represented by the combination of arrows 172A, 172B, 172C and 172D is called herein current path 172.

This general principle may be extended for yet further heterojunction layer sets. If there were yet more heterojunction layer sets, if the source plug 142 extends further down to the respective 2DEG of each additional heterojunction layer set, and the drain plug 153 extends down to that respective 2DEG of each additional heterojunction layer set, then each additional 2DEG may complete a yet further current path between the source contact 141 and the drain contact 151 that would likewise be controlled by the voltage at the gate terminal 161. By providing the multiple parallel paths through respective parallel high electron mobility 2DEGs, the total on-resistance between the source terminal and the drain terminal may be significantly reduced as compared to having only one 2DEG between the source terminal and the drain terminal.

The specific transistor structure 100 also includes other surrounding elements. However, the principles described herein are not limited to what those surrounding elements are. In the very specific example of FIG. 1, the surrounding structure includes metallization that allows for electrical contact with each of the source contact 141, the drain contact 151 and the gate terminal 161, elements used to electrically isolate the transistor structure from surrounding circuits, and layers that provide structural, electrical, chemical and mechanical protection. For example, the vias 181A, 181B and 181C, and metallization portions 182A, 182B and 182C allow voltages and/or signals to be applied between the source contact 141 and the external environment. The vias 183A, 183B and 183C, and metallization portions 184A, 184B and 184C allow voltages and/or signals to be applied between the drain contact 151 and the external environment. Via 185 and Metallization portion 186 facilitates the application of electrical signals to the gate terminal 161. Isolation regions are provided to the left and to the right of the heterojunction layer sets to provide electrical isolation from neighboring circuitry. A SiN/SiO2 stack provides passivation to the structure.

In FIG. 1, the conductive source plug 142 is further from the conductive drain plug 153 than the source contact 141. Also, the gate terminal 161 is further from the conductive drain plug 153 than the source contact 141. However, in an alternative embodiment, the conductive source plug and the gate terminal are on the other side of the source contact 141, being each closer to the conductive drain plug 153 than the source contact 141.

Figure 2:
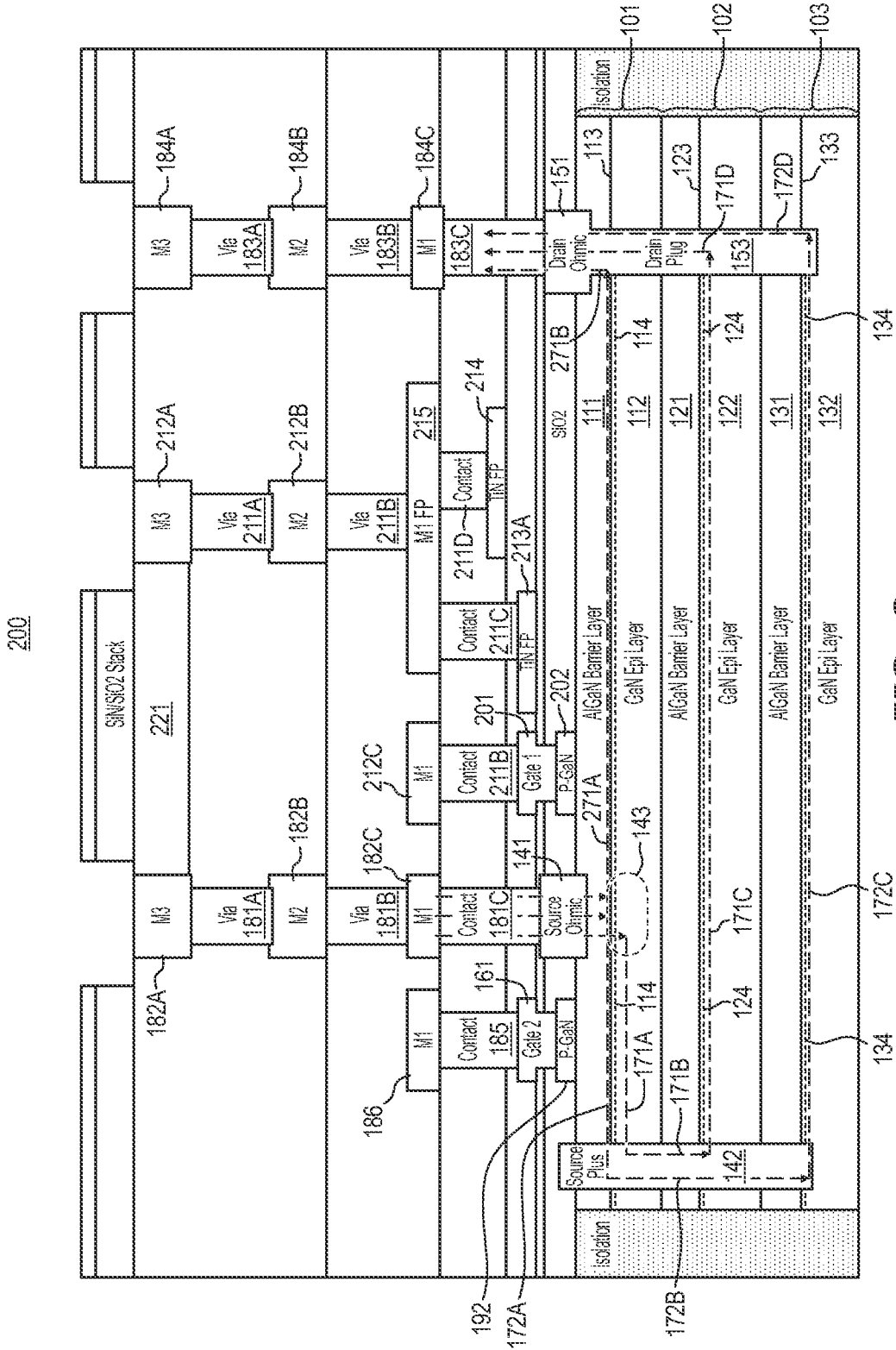
FIG. 2 illustrates an alternative transistor structure that is similar to the transistor structure of FIG. 1, except with an additional gate terminal that allows the transistor structure to act as two transistors sharing a common source and a common drain.

FIG. 2 illustrates an alternative transistor structure 200. The transistor structure 200 of FIG. 2 is similar to the transistor structure 100 of FIG. 1, with similar elements sharing the same reference numbers as were introduced in FIG. 1. As in FIG. 1, voltage applied to the terminal 161 controls whether current flows from the source contact 141 to the drain contact 151 via both the first current flow path 171 and the second flow path 172. Thus, the gate terminal 161 operates as a gate terminal for one transistor (called herein a "first" transistor).

In addition, there is a second gate terminal 201 in proximity to the first 2DEG 114. The second gate terminal 201 may act as a gate terminal of a second transistor that shares the source contact 141 and the drain contact 151. The P-doped portion 202 causes the 2DEG 114 to be discontinuous between the source contact 141 and the drain contact 151 except where an appropriate voltage is applied to the second gate terminal 201. Thus, the gate terminal 201 operates as a gate terminal for a second transistor that shares the source and drain with the first transistor.

Figure 3:
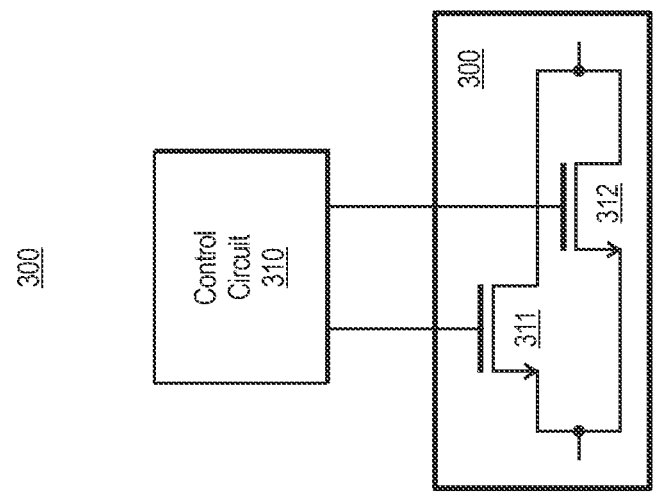
FIG. 3 illustrates an environment that includes a transistor structure and a control circuit that may be used to control the transistor structure of FIG. 2 to operate as a single transistor.

Thus, the transistor structure 200 may represent two independent transistors sharing a common source and drain. On the other hand, the transistor structure 200 may coordinate control of each of the first and second transistors such that the first and second transistors are on and off at the same time, thereby acting as a single transistor. In this case, in order to ensure that the transistors are turned on and off at the same time, the transistor structure may be controlled by a corresponding control circuit. FIG. 3 illustrates an environment 300 that includes a transistor structure 301 and a control circuit. For instance, the transistor structure 301 that may be, for example, the transistor structure 200 of FIG. 2. The transistor structure 301 includes two transistors 311 and 312 that each share a common source and drain. The control circuit 310 applies gate voltages to the gates of each of the transistors 311 and 312.

Figure 4:
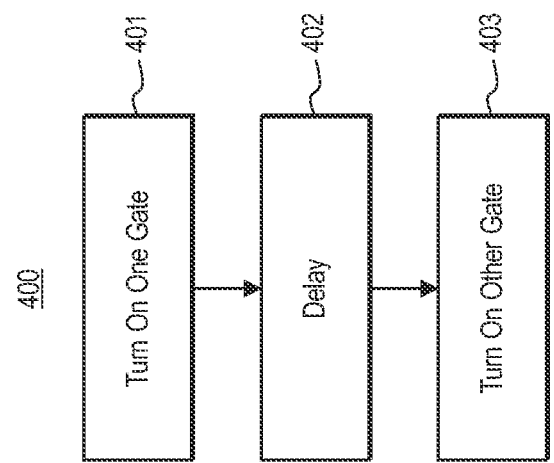

FIG. 4 illustrates a method 400 that is performed by the control circuit 310 in response to determining that the transistor is to be turned on. Specifically, the control circuit 310 applies an on-voltage to one of the gate terminals (act 401), followed by applying an on-voltage to the other of the gate terminals (act 403) after a certain delay (act 402). The amount of delay, and which gate terminal is turned on first, will depend on the turn-on response times of each of the gate terminals. The amount of delay may, for example, be trimmed value that is customized for variations in manufacturing from device to device, and/or may even be trimmed to account for temperature or aging of the transistor.

Turning off the transistors may similarly be performed using the method 400 of FIG. 4, except with a turn-off voltage being applied instead of the turn-on voltage. Specifically, the control circuit 310 applies an off-voltage to one of the gate terminals (act 401), followed by applying an off-voltage to the other of the gate terminals (act 403) after a certain delay (act 402). The amount of turn-off delay, and which gate terminal is turned off first, will depend on the turn-off response times of each of the gate terminals. Furthermore, the amount of delay may be different for turning on the transistors as compared to turning off the transistors. Again, the turn-off delay may be a trimmed value that accounts for variations in manufacturing from device to device, and/or may even be trimmed to account for temperature or aging of the transistor.

Figure 5:
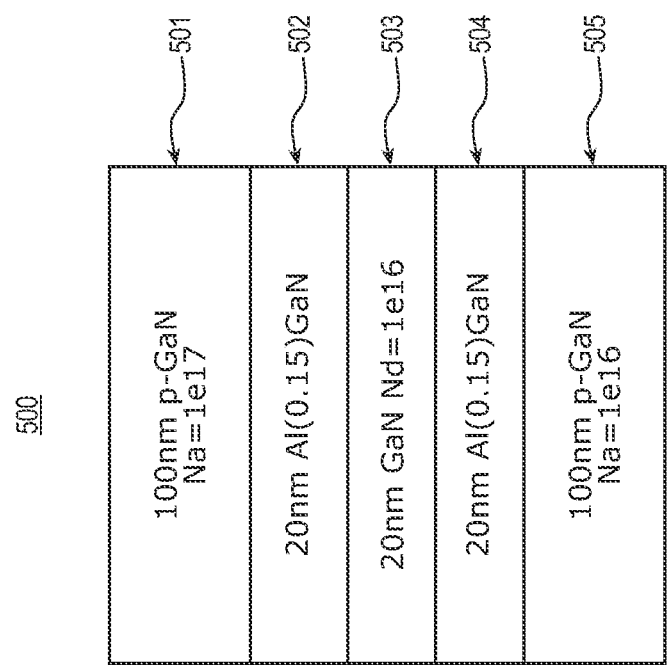
FIG. 5 illustrates an example composition layer profile that may be used in the transistor structure of FIG. 1, or the transistor structure of FIG. 2.

FIG. 5 illustrates an example composition layer profile 500 that may be used in the transistor structure 100 of FIG. 1, or the transistor structure 200 of FIG. 2. The top-most layer 501 is a p-GaN layer that is 100 nm thick and which has been doped with p-type atoms at a density of 1e17 atoms per cubic centimeter. This layer 501 may be, for example the P-doped GaN portion 191 of FIG. 1 or the P-doped portion 202 of FIG. 2. The next layer 502 is an example of the barrier semiconductor layer 111, and is 20 nm thick and with composition Al(0.15)GaN (or in other words 15 percent AlN and 85 percent GaN). The next layer 503 is an example of the channel semiconductor layer 112, and is 20 nm thick GaN with an n-type doping concentration of 1e16 atoms per cubic centimeter.

Layers 502 and 503 thus make up a heterojunction layer set and are capable of forming a 2DEG just within the layer 503. The layers 502 and 503 may repeat for additional lower heterojunction layer sets. The layer 504 represents a barrier semiconductor layer that is 20 nm thick, and with a composition of Al(0.15)GaN. The bottom-most layer 505 is the bottom-most channel semiconductor layer, which is 100 nm of GaN with an n-type doing concentration of 1e16 atoms per cubic centimeter.

Accordingly, an entire heterojunction layer set may be made very thin, potentially on the order of nanometers. For example, the layers 502 and 503 form a heterojunction layer set that is just 40 nm thick. Accordingly, many heterojunction layer sets (perhaps 10 s or hundreds) may be stacked on each other, resulting in 10 s or hundreds of stacked 2DEGs that may each be a parallel path between source and drain.

Accordingly, the principles described herein provide a unique transistor structure that makes use of conductive paths in one or more 2DEGs that are below the most surface-level 2DEG, while still permitting gate control just above the most surface-level 2DEG. This has the potential to provide a significant number of technical benefits depending on how the sub-surface 2DEG(s) is or are used. For instance, the transistor structure may use multiple 2DEGs to channel current between source and drain thereby substantially reducing on-resistance. Furthermore, the transistor structure may even perform as two or more independently controllable transistors that each share source and drain.

Literal Support Section

Clause 1. A transistor structure comprising: a first heterojunction layer set comprising a first barrier semiconductor layer and a first channel semiconductor layer and a first heterojunction formed at an interface between the first barrier semiconductor layer and the first channel semiconductor layer, the first heterojunction inducing a first two-dimensional electron gas (2DEG) within the first channel semiconductor layer; a second heterojunction layer set comprising a second barrier semiconductor layer and a second channel semiconductor layer and a second heterojunction formed at an interface between the second barrier semiconductor layer and the second channel semiconductor layer, the second heterojunction inducing a second 2DEG within the second channel semiconductor layer; a source contact in conductive contact with the first 2DEG at a portion of the first 2DEG; a conductive source plug extending between the first 2DEG and the second 2DEG so as to connect the first 2DEG with the second 2DEG; a gate terminal that is proximate to the first 2DEG such that voltages applied to the gate terminal control whether the first 2DEG is continuous between the conductive source plug and the portion of the first 2DEG that is in conductive contact with the source contact; a drain contact; and a conductive drain plug extending from the drain contact through the first heterojunction layer set through the first 2DEG and to the second 2DEG, wherein when a voltage is applied to the gate terminal that is sufficient that the first 2DEG is continuous between the conductive source plug and the portion of the first 2DEG that is in conductive contact with the source contact, a current path is formed between the source contact and the drain contact via the first 2DEG, the conductive source plug, the second 2DEG, and the conductive drain plug.

Clause 2. The transistor structure of Clause 1, the current path being a first current path, the transistor further comprising: a third heterojunction layer set comprising a third barrier semiconductor layer and a third channel semiconductor layer and a third heterojunction formed at an interface between the third barrier semiconductor layer and the third channel semiconductor layer, the third heterojunction inducing a third 2DEG within the third channel semiconductor layer, the conductive source plug extending between the first 2DEG, the second 2DEG and the third 2DEG so as to connect the first 2DEG, the second 2DEG and the third 2DEG; the conductive drain plug extending from the drain contact through the first 2DEG, through the second 2DEG and to the third 2DEG wherein when the voltage is applied to the gate terminal that is sufficient that the first 2DEG is continuous between the conductive source plug and the portion of the first 2DEG that is in conductive contact with the source contact, a second current path is formed between the source contact and the drain contact via the first 2DEG, the conductive source plug, the third 2DEG, and the conductive drain plug.

Clause 3. The transistor structure of Clause 1, the conductive source plug being further from the conductive drain plug than the source contact, the gate terminal also being further from the conductive drain plug than the source contact.

Clause 4. The transistor structure of Clause 3, the current path being a first current path, the gate terminal being a first gate terminal, the transistor structure further comprising: a second gate terminal that is proximate to the first 2DEG and that is closer to the conductive drain plug than the source contact, such that voltages applied to the second gate terminal control whether the first 2DEG is continuous between the source contact and the conductive drain plug that is in conductive contact with the source contact, wherein when a voltage is applied to the second gate terminal that is sufficient that the first 2DEG is continuous between the source contact and the conductive drain plug, a second current path is formed between the source contact and the drain contact via the first 2DEG and the conductive drain plug.

Clause 5. The transistor structure of Clause 4, the first gate terminal being for a first transistor, and the second gate terminal being of a second transistor that shares the source contact with the first transistor and shares the drain contact with the first transistor.

Clause 6. The transistor structure of Clause 4, further comprising: a control circuit configured to apply a first gate voltage to the first gate terminal and a second gate voltage to the second gate terminal so as to concurrently create the first current path and the second current path and so as to concurrently cut the first current path and the second current path.

Clause 7. The transistor structure of Clause 4, further comprising a control circuit configured to: in response to determining that a transistor of the transistor structure is to be turned on, applying a turn on voltage to the first gate terminal, and then after a delay, applying a turn on voltage to the second gate terminal.

Clause 8. The transistor structure of Clause 4, further comprising a control circuit configured to: in response to determining that a transistor of the transistor structure is to be turned on, applying a turn on voltage to the second gate terminal, and then after a delay, applying a turn on voltage to the first gate terminal.

Clause 9. The transistor structure of Clause 1, the first channel semiconductor layer composed of a same semiconductor material as the second channel semiconductor layer.

Clause 10. The transistor structure of Clause 1, the first barrier semiconductor layer composed of a same semiconductor material as the second barrier semiconductor layer.

Clause 11. The transistor structure of Clause 1, the first channel semiconductor layer composed of a different semiconductor material than the second channel semiconductor layer.

Clause 12. The transistor structure of Clause 1, the first barrier semiconductor layer composed of a different semiconductor material than the second barrier semiconductor layer.

Clause 13. The transistor structure of Clause 1, the first channel semiconductor layer being a GaN layer, the first barrier semiconductor layer being an AlGaN layer.

Clause 14. The transistor structure of Clause 1, the first channel semiconductor layer being a GaN layer, the first barrier semiconductor layer being an AlInGaN layer.

Clause 15. The transistor structure of Clause 1, the first channel semiconductor layer being a GaN layer, the first barrier semiconductor layer being an AlInN layer.

Clause 16. The transistor structure of Clause 1, the first channel semiconductor layer being a GaAs layer, the first barrier semiconductor layer being an AlGaAs layer.

Clause 17. The transistor structure of Clause 1, the first 2DEG and the second 2DEG being parallel.

Clause 18. The transistor structure of Clause 1, the conductive drain plug extending perpendicular to a plane of the first 2DEG and a plane of the second 2DEG.

Clause 19. The transistor structure of Clause 16, the conductive source plug also extending perpendicular to a plane of the first 2DEG and a plane of the second 2DEG.

Clause 20. The transistor structure of Clause 1, the conductive source plug extending perpendicular to a plane of the first 2DEG and a plane of the second 2DEG.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed is:

1. A transistor structure comprising:
   a first heterojunction layer set comprising a first barrier semiconductor layer and a first channel semiconductor layer and a first heterojunction formed at an interface between the first barrier semiconductor layer and the first channel semiconductor layer, the first heterojunction inducing a first two-dimensional electron gas (2DEG) within the first channel semiconductor layer;
   a second heterojunction layer set comprising a second barrier semiconductor layer and a second channel semiconductor layer and a second heterojunction formed at an interface between the second barrier semiconductor layer and the second channel semiconductor layer, the second heterojunction inducing a second 2DEG within the second channel semiconductor layer, the first channel semiconductor layer composed of a different semiconductor material than the second channel semiconductor layer;
   a source contact in conductive contact with the first 2DEG at a portion of the first 2DEG;
   a conductive source plug extending between the first 2DEG and the second 2DEG so as to connect the first 2DEG with the second 2DEG;
   a gate terminal that is proximate to the first 2DEG such that voltages applied to the gate terminal control whether the first 2DEG is continuous between the conductive source plug and the portion of the first 2DEG that is in conductive contact with the source contact;
   a drain contact; and
   a conductive drain plug extending from the drain contact through the first heterojunction layer set through the first 2DEG and to the second 2DEG, wherein when a voltage is applied to the gate terminal that is sufficient that the first 2DEG is continuous between the conductive source plug and the portion of the first 2DEG that is in conductive contact with the source contact, a current path is formed between the source contact and the drain contact via the first 2DEG, the conductive source plug, the second 2DEG, and the conductive drain plug.

2. The transistor structure of claim 1, the current path being a first current path, the transistor further comprising:
   a third heterojunction layer set comprising a third barrier semiconductor layer and a third channel semiconductor layer and a third heterojunction formed at an interface between the third barrier semiconductor layer and the third channel semiconductor layer, the third heterojunction inducing a third 2DEG within the third channel semiconductor layer,
   the conductive source plug extending between the first 2DEG, the second 2DEG and the third 2DEG so as to connect the first 2DEG, the second 2DEG and the third 2DEG;
   the conductive drain plug extending from the drain contact through the first 2DEG, through the second 2DEG and to the third 2DEG wherein when the voltage is applied to the gate terminal that is sufficient that the first 2DEG is continuous between the conductive source plug and the portion of the first 2DEG that is in conductive contact with the source contact, a second current path is formed between the source contact and the drain contact via the first 2DEG, the conductive source plug, the third 2DEG, and the conductive drain plug.

3. The transistor structure of claim 1, the conductive source plug being further from the conductive drain plug than is the source contact, the gate terminal also being further from the conductive drain plug than is the source contact.

4. The transistor structure of claim 3, the current path being a first current path, the gate terminal being a first gate terminal, the transistor structure further comprising:
   a second gate terminal that is proximate to the first 2DEG and that is closer to the conductive drain plug than is the source contact, such that voltages applied to the second gate terminal control whether the first 2DEG is continuous between the source contact and the conductive drain plug that is in conductive contact with the source contact,
   wherein when a voltage is applied to the second gate terminal that is sufficient that the first 2DEG is continuous between the source contact and the conductive drain plug, a second current path is formed between the source contact and the drain contact via the first 2DEG and the conductive drain plug.

5. The transistor structure of claim 4, the first gate terminal being for a first transistor, and the second gate terminal being for a second transistor that shares the source contact with the first transistor and shares the drain contact with the first transistor.

6. The transistor structure of claim 4, further comprising:
   a control circuit configured to apply a first gate voltage to the first gate terminal and a second gate voltage to the second gate terminal so as to concurrently create the first current path and the second current path and so as to concurrently cut the first current path and the second current path.

7. The transistor structure of claim 4, further comprising a control circuit configured to:
   in response to determining that a transistor of the transistor structure is to be turned on, applying a turn on voltage to the first gate terminal, and then after a delay, applying a turn on voltage to the second gate terminal.

8. The transistor structure of claim 4, further comprising a control circuit configured to:
   in response to determining that a transistor of the transistor structure is to be turned on, applying a turn on voltage to the second gate terminal, and then after a delay, applying a turn on voltage to the first gate terminal.

9. The transistor structure of claim 1, the first barrier semiconductor layer composed of a same semiconductor material as the second barrier semiconductor layer.

10. The transistor structure of claim 1, the first barrier semiconductor layer composed of a different semiconductor material than the second barrier semiconductor layer.

11. The transistor structure of claim 1, the first channel semiconductor layer being a GaN layer, the first barrier semiconductor layer being an AlGaN layer.

12. The transistor structure of claim 1, the first channel semiconductor layer being a GaN layer, the first barrier semiconductor layer being an AlInGaN layer.

13. The transistor structure of claim 1, the first channel semiconductor layer being a GaN layer, the first barrier semiconductor layer being an AlInN layer.

14. The transistor structure of claim 1, the first channel semiconductor layer being a GaAs layer, the first barrier semiconductor layer being an AlGaAs layer.

15. The transistor structure of claim 1, the first 2DEG and the second 2DEG being parallel.

16. The transistor structure of claim 1, the conductive drain plug extending perpendicular to a plane of the first 2DEG and a plane of the second 2DEG.

17. The transistor structure of claim 1, the conductive source plug extending perpendicular to a plane of the first 2DEG and a plane of the second 2DEG.

18. A transistor structure comprising:
a first heterojunction layer set comprising a first barrier semiconductor layer and a first channel semiconductor layer and a first heterojunction formed at an interface between the first barrier semiconductor layer and the first channel semiconductor layer, the first heterojunction inducing a first two-dimensional electron gas (2DEG) within the first channel semiconductor layer;
a second heterojunction layer set comprising a second barrier semiconductor layer and a second channel semiconductor layer and a second heterojunction formed at an interface between the second barrier semiconductor layer and the second channel semiconductor layer, the second heterojunction inducing a second 2DEG within the second channel semiconductor layer, the first barrier semiconductor layer composed of a different semiconductor material than the second barrier semiconductor layer;
a source contact in conductive contact with the first 2DEG at a portion of the first 2DEG;
a conductive source plug extending between the first 2DEG and the second 2DEG so as to connect the first 2DEG with the second 2DEG;
a gate terminal that is proximate to the first 2DEG such that voltages applied to the gate terminal control whether the first 2DEG is continuous between the conductive source plug and the portion of the first 2DEG that is in conductive contact with the source contact;
a drain contact; and
a conductive drain plug extending from the drain contact through the first heterojunction layer set through the first 2DEG and to the second 2DEG, wherein when a voltage is applied to the gate terminal that is sufficient that the first 2DEG is continuous between the conductive source plug and the portion of the first 2DEG that is in conductive contact with the source contact, a current path is formed between the source contact and the drain contact via the first 2DEG, the conductive source plug, the second 2DEG, and the conductive drain plug.

19. A transistor structure comprising:
a first heterojunction layer set comprising a first barrier semiconductor layer and a first channel semiconductor layer and a first heterojunction formed at an interface between the first barrier semiconductor layer and the first channel semiconductor layer, the first heterojunction inducing a first two-dimensional electron gas (2DEG) within the first channel semiconductor layer;
a second heterojunction layer set comprising a second barrier semiconductor layer and a second channel semiconductor layer and a second heterojunction formed at an interface between the second barrier semiconductor layer and the second channel semiconductor layer, the second heterojunction inducing a second 2DEG within the second channel semiconductor layer;
a source contact in conductive contact with the first 2DEG at a portion of the first 2DEG;
a conductive source plug extending between the first 2DEG and the second 2DEG so as to connect the first 2DEG with the second 2DEG;
a gate terminal that is proximate to the first 2DEG such that voltages applied to the gate terminal control whether the first 2DEG is continuous between the conductive source plug and the portion of the first 2DEG that is in conductive contact with the source contact;
a drain contact; and
a conductive drain plug extending from the drain contact through the first heterojunction layer set through the first 2DEG and to the second 2DEG, wherein when a voltage is applied to the gate terminal that is sufficient that the first 2DEG is continuous between the conductive source plug and the portion of the first 2DEG that is in conductive contact with the source contact, a current path is formed between the source contact and the drain contact via the first 2DEG, the conductive source plug, the second 2DEG, and the conductive drain plug,
the conductive source plug being further from the conductive drain plug than is the source contact, the gate terminal also being further from the conductive drain plug than is the source contact, the current path being a first current path, the gate terminal being a first gate terminal, the transistor structure further comprising:
a second gate terminal that is proximate to the first 2DEG and that is closer to the conductive drain plug than is the source contact, such that voltages applied to the second gate terminal control whether the first 2DEG is continuous between the source contact and the conductive drain plug that is in conductive contact with the source contact, wherein when a voltage is applied to the second gate terminal that is sufficient that the first 2DEG is continuous between the source contact and the conductive drain plug, a second current path is formed between the source contact and the drain contact via the first 2DEG and the conductive drain plug; and
a control circuit configured to, in response to determining that a transistor of the transistor structure is to be turned on, applying a turn on voltage to the first gate terminal, and then after a delay, applying a turn on voltage to the second gate terminal.

20. A transistor structure comprising:
a first heterojunction layer set comprising a first barrier semiconductor layer and a first channel semiconductor layer and a first heterojunction formed at an interface between the first barrier semiconductor layer and the first channel semiconductor layer, the first heterojunction inducing a first two-dimensional electron gas (2DEG) within the first channel semiconductor layer;
a second heterojunction layer set comprising a second barrier semiconductor layer and a second channel semiconductor layer and a second heterojunction formed at an interface between the second barrier semiconductor layer and the second channel semiconductor layer, the second heterojunction inducing a second 2DEG within the second channel semiconductor layer;
a source contact in conductive contact with the first 2DEG at a portion of the first 2DEG;
a conductive source plug extending between the first 2DEG and the second 2DEG so as to connect the first 2DEG with the second 2DEG;
a gate terminal that is proximate to the first 2DEG such that voltages applied to the gate terminal control whether the first 2DEG is continuous between the conductive source plug and the portion of the first 2DEG that is in conductive contact with the source contact;

a drain contact; and a conductive drain plug extending from the drain contact through the first heterojunction layer set through the first 2DEG and to the second 2DEG, wherein when a voltage is applied to the gate terminal that is sufficient that the first 2DEG is continuous between the conductive source plug and the portion of the first 2DEG that is in conductive contact with the source contact, a current path is formed between the source contact and the drain contact via the first 2DEG, the conductive source plug, the second 2DEG, and the conductive drain plug, the conductive source plug being further from the conductive drain plug than is the source contact, the gate terminal also being further from the conductive drain plug than is the source contact, the current path being a first current path, the gate terminal being a first gate terminal, the transistor structure further comprising:

a second gate terminal that is proximate to the first 2DEG and that is closer to the conductive drain plug than is the source contact, such that voltages applied to the second gate terminal control whether the first 2DEG is continuous between the source contact and the conductive drain plug that is in conductive contact with the source contact, wherein when a voltage is applied to the second gate terminal that is sufficient that the first 2DEG is continuous between the source contact and the conductive drain plug, a second current path is formed between the source contact and the drain contact via the first 2DEG and the conductive drain plug; and a control circuit configured to, in response to determining that a transistor of the transistor structure is to be turned on, applying a turn on voltage to the second gate terminal, and then after a delay, applying a turn on voltage to the first gate terminal.

* * * * *